March 25, 1969 S. E. HAVN 3,435,280
DEFLECTION CIRCUIT
Filed June 28, 1965

INVENTOR:
SVEND E. HAVN,
BY William S. Wolfe
HIS ATTORNEY.

United States Patent Office 3,435,280

Patented Mar. 25, 1969

3,435,280

DEFLECTION CIRCUIT

Svend E. Havn, Liverpool, N.Y., assignor to General Electric Company, a corporation of New York Filed June 28, 1965, Ser. No. 467,776
Int. Cl. H01j 29/76
U.S. Cl. 315—27 5 Claims

ABSTRACT OF THE DISCLOSURE

A transistorized horizontal deflection circuit for a television receiver includes a flyback transformer which has a tapped primary winding. A first portion of that winding is connected across the horizontal deflection coils of the receiver's cathode ray tube; the tap of the primary is connected to an emitter of a switching transistor; and a second portion of the primary is coupled through a horizontal buffer transformer to the transistor's base. When the transistor is placed in a conducting condition at the beginning of a trace interval by a pulse from a horizontal driver stage coupled to the buffer transformer, regenerative feedback from the second portion of the flyback transformer keeps the transistor conducting throughout that interval.

Figure 1:
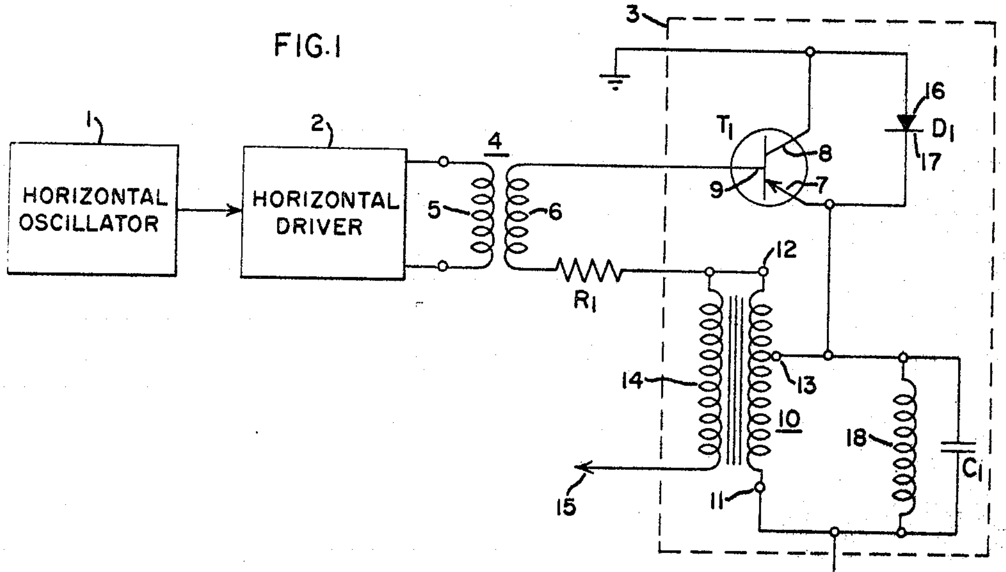

The present invention relates to deflection circuitry for use in television receivers and more specifically to a transistorized horizontal deflection circuit for use in such receivers.

It is necessary in a television receiver to develop a sawtooth current waveform at the horizontal frequency for application to the deflection yoke of the cathode ray tube. Generally, the horizontal output stage wherein the sawtooth waveform is developed comprises an electronic switching element rendered conductive at the horizontal frequency by pulses coupled thereto from a horizontal driver stage, the driver stage being coupled to the switching element by a suitable buffer transformer. Since certain transistors can perform the necessary switching operation in extremely efficient fashion it is often desirable to utilize a suitable transistor as the electronic switching element of the horizontal output stage.

However, the use of a switching transistor in this manner raises certain problems, the prior art approaches to which have not been completely satisfactory. More specifically, special techniques have been necessary to supply sufficient drive to the base of the transistor during the entire trace portion of the deflection signal in order to maintain the transistor conductive during the entire trace portion. Since the driver stage is generally rendered conductive only during the retrace portion of the deflection signal to thereby switch off the output transistor during this interval, the current necessary to maintain the transistor in conduction during trace must be supplied to the transistor during the time when the driver stage is nonconductive. Accordingly, the necessary drive for the transistor must be derived from energy stored in the buffer transformer.

In the past, several approaches to this problem have been utilized, however, none of these approaches have been entirely satisfactory. Thus, for example, a buffer transistor having a relatively high power rating has been employed to allow sufficient storage of energy in the buffer transformer during the relatively short retrace time to maintain the output transistor conductive during the entire trace. Another approach has employed circuit elements in addition to those normally employed in the output stage, the additional elements being utilized for the storage of energy during the retrace period and the stored energy then being utilized to maintain conduction during the trace period. Both of these approaches add undue expense and complexity to the horizontal deflection system which detracts considerably from the advantages gained through use of a transistor to perform the necessary switching.

The present invention provides a simplified and inexpensive horizontal output circuit employing a switching transistor which is maintained conductive during the entire trace portion of the deflection signal.

Accordingly, an object of the invention is to provide an improved horizontal deflection circuit for television receivers.

Another object is to provide an improved transistorized horizontal deflection circuit which is less complex and expensive than prior art circuits.

A further object is to provide an improved transistorized horizontal deflection circuit wherein conduction of the output transistor is maintained during the entire trace period without the necessity of additional circuit elements.

These and other objects are achieved in one embodiment of the invention through the use of the primary of the fly-back transformer conventionally connected in the emitter-collector circuit of the output transistor to produce a regenerative feedback voltage which is applied to the base electrode of the transistor to maintain the transistor in conduction during the entire trace. The transformer comprises a primary winding having first and second ends and an intermediate tap therebetween, one end of the winding being connected to the suitable power supply means while the tap is connected to the emitter of the output transistor. The second end of the primary winding is connected to the base of the output transistor. In this manner, the portion of the primary winding between the tap and the second end serves as a source of voltage having a polarity which maintains the output transistor in conduction during the entire trace portion of the deflection signal.

Figure 2:
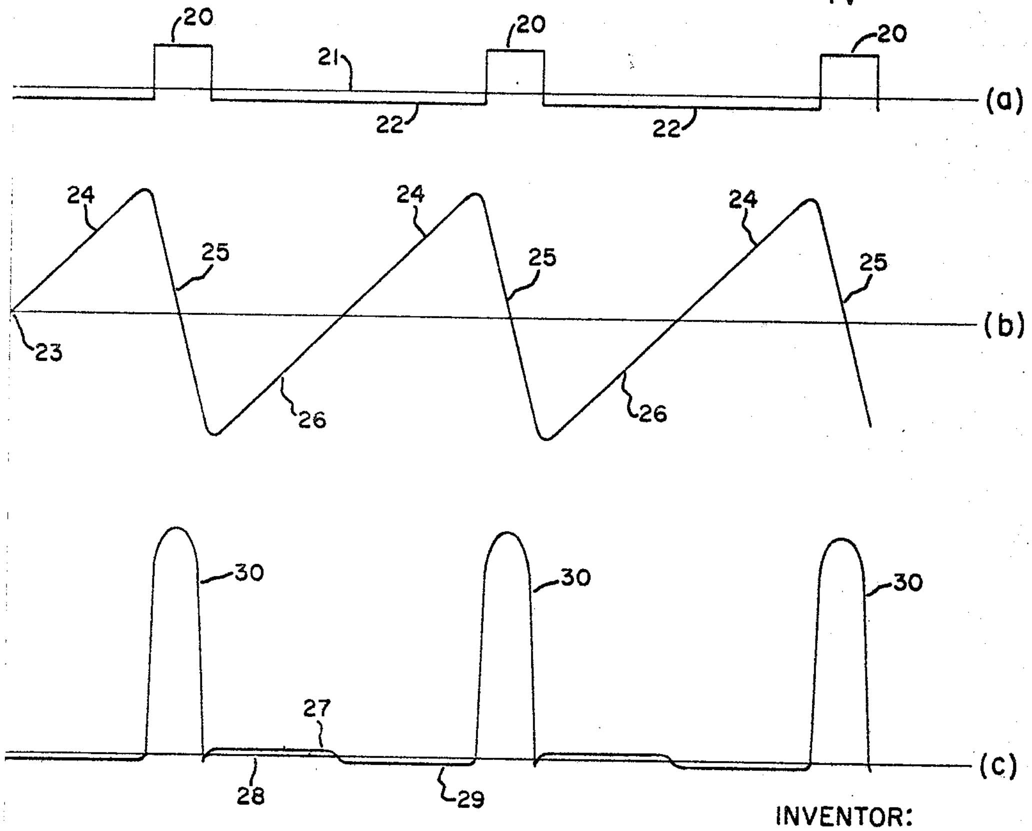

The novel and distinctive features of the invention are set forth in the appended claims. The invention itself together with further objects and advantages thereof, may best be understood by reference to the accompanying drawing in which:

FIGURE 1 is a schematic diagram of a horizontal deflection circuit in accordance with the invention, and FIGURE 2 depicts waveforms at various points in the circuit of FIGURE 1.

Referring to FIGURE 1, there is shown a transistorized horizontal deflection circuit in accordance with the invention. A horizontal oscillator generally shown at 1, develops a control signal at the horizontal frequency of 15.75 kc., the control signal being synchronized to the horizontal deflection components of a received composite video signal in conventional fashion. The horizontal oscillator 1 includes suitable automatic frequency control circuitry for maintaining the necessary synchronism between the output of the oscillator and the received horizontal deflection components.

A synchronized signal at 15.75 kc. thus appears at the output of the horizontal oscillator 1 and is applied to a horizontal driver stage generally shown at 2. The driver stage 2 produces a pulse output at the horizontal frequency, such pulses being applied to a horizontal output stage generally shown at 3 via a buffer transformer 4 having primary and secondary windings 5 and 6 respectively in such a manner that positive going pulses appear across the secondary 6.

The horizontal output stage 3 comprises a PNP transistor $T_1$ having emitter, collector and base electrodes 7, 8 and 9 respectively. In accordance with the invention a fly-back transformer is provided including a primary winding 10 having first and second ends 11 and 12 respectively and an intermediate tap 13 therebetween. The end 11 of the primary winding 10 is connected to a suitable voltage supply while the tap 13 is connected to the emitter 7 of the transistor, the collector 8 of the transistor being grounded. The end 12 of primary winding 10 is connected through a current limiting resistor $R_1$ and the secondary 6 of buffer transformer 4 to the base 9 of transistor $T_1$, the portion of the primary winding 10 between end 12 and tap 13 serving to apply a regenerative feedback voltage to the base 9 to maintain the transistor in conduction during the entire trace portion of the deflection signal.

The fly-back transformer further includes a tertiary winding 14 magnetically coupled to the primary winding 10 to develop a high voltage at the terminal 15 in accordance with known techniques.

A damper diode $D_1$ having anode and cathode electrodes 16 and 17 respectively is connected in shunt with the transistor $T_1$ in conventional fashion, anode 16 being connected to ground while the cathode 17 is connected to the emitter 7 of transistor $T_1$.

A horizontal deflection yoke generally shown at 18 is connected between the source of DC voltage and the emitter 7 of transistor $T_1$, the transistor thereby controlling the deflection current flowing through the deflection yoke 18. In addition, a capacitor $C_1$ is connected in shunt with the deflection yoke 18 to tune the deflection yoke to the retrace frequency in conventional fashion.

The operation of the circuit of FIGURE 1 can most easily be understood by referring to the waveforms depicted in FIGURE 2. FIGURE 2*a* depicts the positive going pulses 20 which are applied to the base 9 of transistor $T_1$ via the buffer transformer 4, the ground reference level being represented at 21. The pulses 20 define the retrace portion of the deflection signal, the signal applied to the base 9 going below the ground reference level 21 during the trace period as indicated at 22. The trace and retrace portions of the deflection signal have durations of 53.5 $\mu$s. and 10 $\mu$s. respectively. The positive going pulses 20 serve to render the transistor $T_1$ nonconductive during the retrace portion of the deflection signal.

The operation of the circuit of FIGURE 1 can be understood by reference to FIGURE 2*b* which depicts the sawtooth deflection current produced in the deflection yoke 18. Assuming the transistor $T_1$ to be rendered initially conductive at point 23 of the waveform and the damper diode $D_1$ to be back biased at this point, current flows through the deflection yoke 18 and the emitter-collector circuit of the transistor $T_1$ to develop a positive going sawtooth waveform 24 in accordance with well known principles. Upon the occurrence of a positive going pulse 20, the transistor $T_1$ is switched off thereby interrupting the initial current path, the damper diode remaining back biased. When the initial current path is interrupted in this manner, the deflection yoke 18 and the capacitor $C_1$ define a tank circuit resonant at a frequency such that one-half cycle of circulating current flows between the yoke 18 and capacitor $C_1$ during retrace as indicated at 25. At the end of the half-cycle the polarity of the voltage at the cathode 17 of the damper diode $D_1$ has reversed so that the damper diode $D_1$ is now forward biased thereby defining a current path through the damper diode $D_1$ and the deflection yoke 18 which produces the negative portion 26 of the sawtooth waveform. At the point where the sawtooth wave passes through zero, the diode $D_1$ becomes back biased and the transistor $T_1$ conducts the entire sawtooth current thus again producing the positive going portion 24 of the sawtooth waveform. This sequence is repeated for each cycle of the sawtooth waveform.

Referring to FIGURE 2*c* there is shown the voltage waveform occurring at the emitter 7 of the transistor $T_1$ of FIGURE 1. As depicted this voltage is maintained at a level 27 slightly above the ground reference potential 28 when the damper diode $D_1$ is conducting and at a slightly negative potential 29 when the transistor $T_1$ is conducting. However, during retrace when the transistor $T_1$ and damper diode $D_1$ are nonconducting a voltage pulse 30 is produced at emitter 7 as shown.

It is found in the circuit of FIGURE 1 that, absent the improvement of the invention, it is difficult to maintain the transistor $T_1$ in conduction during the entire relatively long trace portion of the deflection signal. This difficulty arises from the fact that the drive to the base 9 of the transistor $T_1$ must be derived from energy stored in the buffer transformer during the relatively short retrace time since the horizontal driver stage is conductive only during retrace and not during trace. Thus, in the past it has been difficult to keep the transistor $T_1$ in saturation during the last few microseconds of the trace time without the use of relatively complex and expensive circuit techniques.

In accordance with the invention, the tapped primary winding 10 of the fly-back transformer in effect serves as an autotransformer to develop a regenerative feedback voltage for maintaining the transistor conductive during the desired interval. Thus, the current flowing in the portion of the primary winding 10 between end 11 and tap 13 during conduction of the transistor $T_1$ induces a regenerative feedback voltage at the end 12 of the primary winding 10. The portion of winding 10 between the end 12 and the tap 13 thus serves as a source of voltage which is applied to the base 9 of transistor $T_1$ to provide the necessary drive during the entire trace portion of the deflection signal thereby ensuring conduction of the transistor for the necessary interval. Conversely, during the negative portion 25 of the sawtooth deflection signal when the damper diode $D_1$ initially conducts, the current flow in the portion of the winding between end 11 and tap 13 is reversed so that a degenerative feedback signal is applied to the base 9 of transistor $T_1$ thereby tending to increase the rapidity of switching of the transistor $T_1$.

In one particularly successful embodiment of the invention the following circuit values were utilized:

Transistor $T_1$—type B10163 (Bendix)
Diode $D_1$—type B224 (Bendix).
Primary winding 10—66 turns between end 11 and tap 13 and 4 turns between tap 13 and end 12.
Deflection yoke 18—.120 mh. and .25 ohm.
Capacitor $C_1$—.056 $\mu$f.
Resistor $R_1$—4.7 ohms.

Although the invention has been described with respect to certain specific embodiments it will be appreciated that modifications and changes may be made by those skilled in the art without departing from the true spirit and scope of the invention.

What is claimed as new and desired to be secured by Letters Patent of the United States is:

1. A deflection circuit for applying a deflection signal having a trace portion to the deflection winding of a television receiver, said circuit comprising:
   (a) a switching transistor having first, second, and third electrodes, said first electrode controlling the switching between said second and third electrodes,
   (b) power supply means,
   (c) flyback transformer winding means connected in circuit with said power supply means and said second and third electrodes,
   (d) said winding means including means for developing a regenerative feedback voltage during the trace portion of the deflection signal, and
   (e) means applying said regenerative feedback voltage to said first electrode to maintain said transistor in conduction during the trace portion of the deflection signal.

2. A deflection circuit for applying a deflection signal having a trace portion to the deflection winding of a television receiver, said circuit comprising:

(a) a switching transistor having first, second and third electrodes, said first electrode controlling the switching between said second and third electrodes, (b) power supply means, (c) flyback transformer winding means including a first winding having first and second ends and an intermediate tap therebetween, (d) means connecting said first end of said first winding to said power supply means, (e) means connecting said tap of said first winding in circuit with said second and third electrodes, (f) means connecting said second end of said first winding to said first electrode, and (g) the portion of said winding between said second end and said tap developing a regenerative feedback voltage at said first electrode to maintain said transistor conductive during the trade portion of the deflection signal.

3. A deflection circuit for applying a deflection signal having trace and retrace portions to the deflection winding of a television receiver, said circuit comprising:

(a) a switching transistor having base, emitter and collector electrodes, (b) means for applying pulses to said base electrode for rendering said transistor nonconductive during the retrace portion of the deflection signal, (c) power supply means, (d) a damper diode having anode and cathode electrodes, said cathode electrode being connected to said collector electrode of said transistor, (e) a first winding having first and second ends and an intermediate tap therebetween, (f) means connecting said first end of said first winding to said power supply means, (g) means connecting said tap of said first winding to said emitter electrode of said switching transistor and to said anode of said damper diode, (h) means connecting said second end of said first winding to said base electrode, and (i) the portion of said winding between said second end and said tap developing a regenerative feedback voltage at said base electrode during the trace portion of the deflection signal to maintain said transistor conductive during the trace.

4. The circuit defined in claim 3 wherein the deflection winding is connected between said power supply means and said emitter electrode.

5. The circuit defined in claim 3 wherein said first winding is the primary of a flyback transformer including a second winding magnetically coupled to said first winding for developing a high voltage across said second winding.

References Cited

UNITED STATES PATENTS

| | | | |
|---|---|---|---|
| 3,122,674 | 2/1964 | Buechel | 315—27 |
| 3,174,074 | 3/1965 | Massman | 315—27 |
| 3,257,578 | 6/1966 | Daute | 315—27 |

RODNEY D. BENNETT, *Primary Examiner.*

CHARLES L. WHITHAM, *Assistant Examiner.*